(12) United States Patent
Yao et al.

(10) Patent No.: US 8,048,322 B2
(45) Date of Patent: Nov. 1, 2011

(54) METHOD FOR MANUFACTURING THERMAL INTERFACE MATERIAL HAVING CARBON NANOTUBES

(75) Inventors: Yuan Yao, Shenzhen (CN);
Chang-Hong Liu, Beijing (CN)

(73) Assignees: Tsinghua University, Beijing (CN);
Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 726 days.

(21) Appl. No.: 12/171,307

(22) Filed: Jul. 11, 2008

(65) Prior Publication Data

US 2009/0032496 A1 Feb. 5, 2009

(30) Foreign Application Priority Data

Jul. 13, 2007 (CN) .......................... 2007 1 0076044

(51) Int. Cl.
*C23F 1/00* (2006.01)
(52) U.S. Cl. .................. 216/2; 216/8; 216/74; 216/96; 977/742
(58) Field of Classification Search .................. 216/2, 8, 216/74, 96; 977/742
See application file for complete search history.

(56) References Cited

U.S. PATENT DOCUMENTS

| | | | |
|---|---|---|---|
| 7,148,512 B2 | 12/2006 | Leu et al. | |
| 7,183,003 B2 | 2/2007 | Leu et al. | |
| 2003/0111333 A1* | 6/2003 | Montgomery et al. | 204/164 |
| 2004/0009353 A1* | 1/2004 | Knowles et al. | 428/411.1 |
| 2006/0231970 A1* | 10/2006 | Huang et al. | 264/134 |
| 2006/0234056 A1* | 10/2006 | Huang et al. | 428/408 |
| 2007/0004081 A1* | 1/2007 | Hsiao | 438/106 |
| 2007/0059864 A1 | 3/2007 | Huang et al. | |
| 2007/0244245 A1* | 10/2007 | Liu et al. | 524/496 |
| 2008/0131722 A1* | 6/2008 | Suhir et al. | 428/616 |
| 2010/0267205 A1* | 10/2010 | Ward et al. | 438/122 |

OTHER PUBLICATIONS

Wikipedia, The Free Encyclopedia, "Mercury (element)", http://en.wikipedia.org/wiki/Mercury_(element) ; 21 pages; 2011.*
Wikipedia, The Free Encyclopedia, "Curing (chemistry)", http://en.wikipedia.org/wiki/Curing_(chemistry) ; 1 page; 2011.*

* cited by examiner

*Primary Examiner* — Binh X Tran
(74) *Attorney, Agent, or Firm* — Altis Law Group, Inc.

(57) ABSTRACT

A method for manufacturing a thermal interface material includes the following steps: providing a carbon nanotube array formed on a substrate, the carbon nanotube array having a number of carbon nanotubes and a number of interstices between the adjacent carbon nanotubes; filling a liquid state first base material into the interstices; curing the first base material, thereby achieving a carbon nanotube/first base material composite; dripping a liquid state second base material onto the surface of the carbon nanotube/first base material composite, the first base material melting and flowing out of the carbon nanotube/first base material composite, until the carbon nanotube array being substantially submerged in the second base material; and curing the second base material, thereby achieving a thermal interface material.

15 Claims, 6 Drawing Sheets

METHOD FOR MANUFACTURING THERMAL INTERFACE MATERIAL HAVING CARBON NANOTUBES

TECHNICAL FIELD

The present invention relates to methods of manufacturing thermal interface materials, and more particularly to a method for manufacturing a thermal interface material having carbon nanotubes that conduct heat.

BACKGROUND

Electronic components such as semiconductor chips are becoming progressively smaller with each new product release, while at the same time the heat dissipation requirements of semiconductor chips are increasing due to their improved capacity to process more data faster. Commonly, a thermal interface material is utilized between an electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/m·K (watts/meter·Kelvin) at room temperature. However, if carbon nanotubes are filled in a base material randomly, each of heat conduction paths within the base material may include two or more adjoining carbon nanotubes. The junction between each two adjoining carbon nanotubes represents a point of thermal resistance when heat travels from one of the carbon nanotubes to the other carbon nanotubes. If a heat conduction path contains more than one point of thermal resistance, the sum total of thermal resistance for the heat conduction path may be significant. Further, if the base material contains a large proportion of heat conduction paths having points of thermal resistance, the overall thermal resistance of the filled base material may be unacceptably high.

Because of the above-described problems, a method for producing an aligned carbon nanotube thermal interface structure has been developed. In a batch process, a capacitor is immersed in a bath containing a slurry of thermoplastic polymer containing randomly oriented carbon nanotubes, and is then energized to create an electrical field to orient the carbon nanotubes prior to curing. However, the method necessarily involves rearranging the randomly oriented carbon nanotubes by application of the electrical field. Variations in the electrical field intensity and direction are liable to occur, and this can lead to asymmetric distributions of the carbon nanotubes in the thermal interface structure. Furthermore, the more air exists in thermal interface structure, and thereby the carbon nanotubes cannot completely contact with the base material. When this happens, the overall thermal resistance of the thermal interface structure is increased.

What is needed, therefore, is a method for manufacturing a thermal interface material which ensures that carbon nanotubes in the thermal interface material have good alignment and less air.

SUMMARY

One method for manufacturing a thermal interface material includes the following steps: providing a carbon nanotube array formed on a substrate, the carbon nanotube array having a number of carbon nanotubes and a number of interstices between the adjacent carbon nanotubes; filling a liquid state first base material into the interstices; curing the first base material, thereby achieving a carbon nanotube/first base material composite; dripping a liquid state second base material onto the surface of the carbon nanotube/first base material composite, the first base material melting and flowing out of the carbon nanotube/first base material composite, until the carbon nanotube array being substantially submerged in the second base material; and curing the second base material, thereby achieving a thermal interface material.

Another method for manufacturing a thermal interface material includes the following steps: providing a device, the device being a hollow member that defines an inner space, wherein the device comprises a sidewall and at least one through hole, the sidewall comprises an upper opening and a lower opening, and the through holes are defined in the sidewall and adjacent to the lower opening; providing a carbon nanotube array formed on a substrate, the carbon nanotube array comprising a plurality of carbon nanotubes and a plurality of interstices between the adjacent carbon nanotubes; arranging the carbon nanotube array with the substrate into the inner space of the device, the lower opening being in contact with and corresponding to the substrate; filling a liquid state first base material into the intersticts via the upper opening; curing the first base material, thereby achieving a carbon nanotube/first base material composite; dripping a liquid state second base material onto the surface of the carbon nanotube/first base material composite via the upper opening, the first base material melting and leaking through the through holes, until the carbon nanotube array being substantially submerged in the second base material; and curing the second base material, thereby achieving a thermal interface material.

Compared with the conventional method for manufacturing a thermal interface material, the present method has the following advantages: firstly, the base material is filled into the carbon nanotube array by in-situ filling, and thereby the carbon nanotube array can keep their original orientations and arrangement. That is, the carbon nanotube array and the base material are formed together, with the carbon nanotubes maintained in a uniform array. Secondly, the less air survives in the thermal interface material, and the base material and the carbon nanotube array are completely in contact with each other. Thereby, the overall thermal resistance of the thermal interface material is low.

Other advantages and novel features will become more apparent from the following detailed description when taken in conjunction with the accompanying drawings.

BRIEF DESCRIPTION OF THE DRAWINGS

The components shown are not necessarily to scale, the emphasis instead being placed upon clearly illustrating the principles of the present method for manufacturing a thermal interface material. Moreover, like reference numerals designate corresponding parts throughout the several views.

DETAILED DESCRIPTION OF PREFERRED EMBODIMENTS

A method for manufacturing a thermal interface material will now be described in detail below and with reference to the drawings. The method comprises the following steps.

Figure 1:
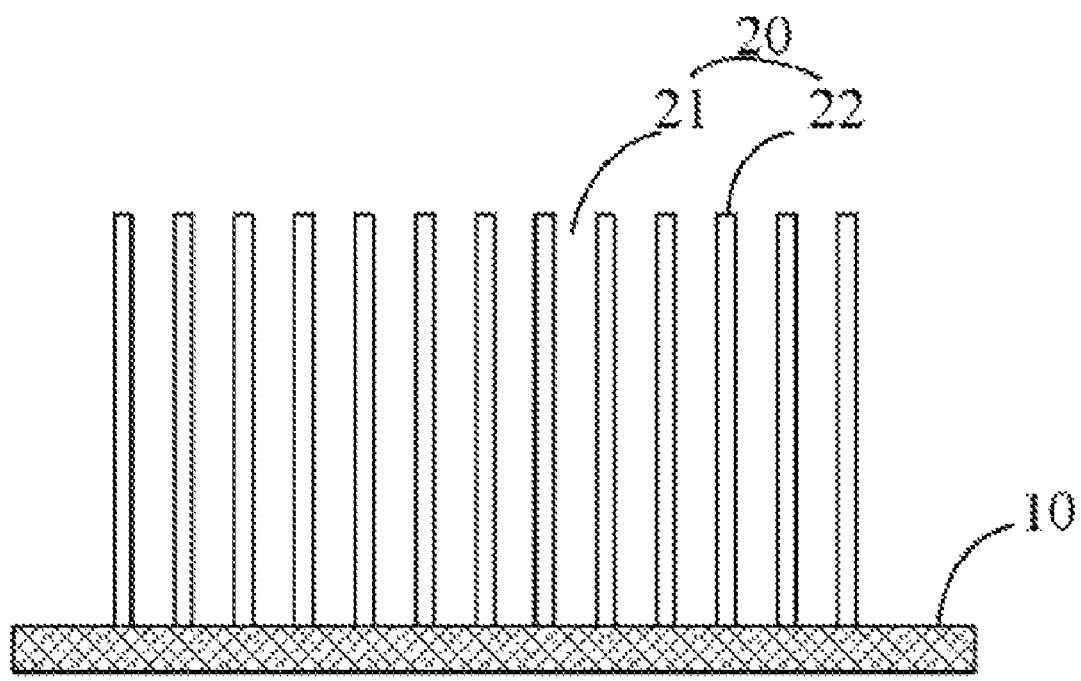
FIG. 1 is a carbon nanotube array formed on a substrate.

Referring to FIG. 1, in step 1, a carbon nanotube array 20 formed on a substrate 10 is provided. The carbon nanotube array 20 includes a number of carbon nanotubes 22, and a number of interstices 21 defined between the adjacent carbon nanotubes 22. The carbon nanotubes 22 are substantially parallel to each other and perpendicular to the substrate 10.

Figure 2:
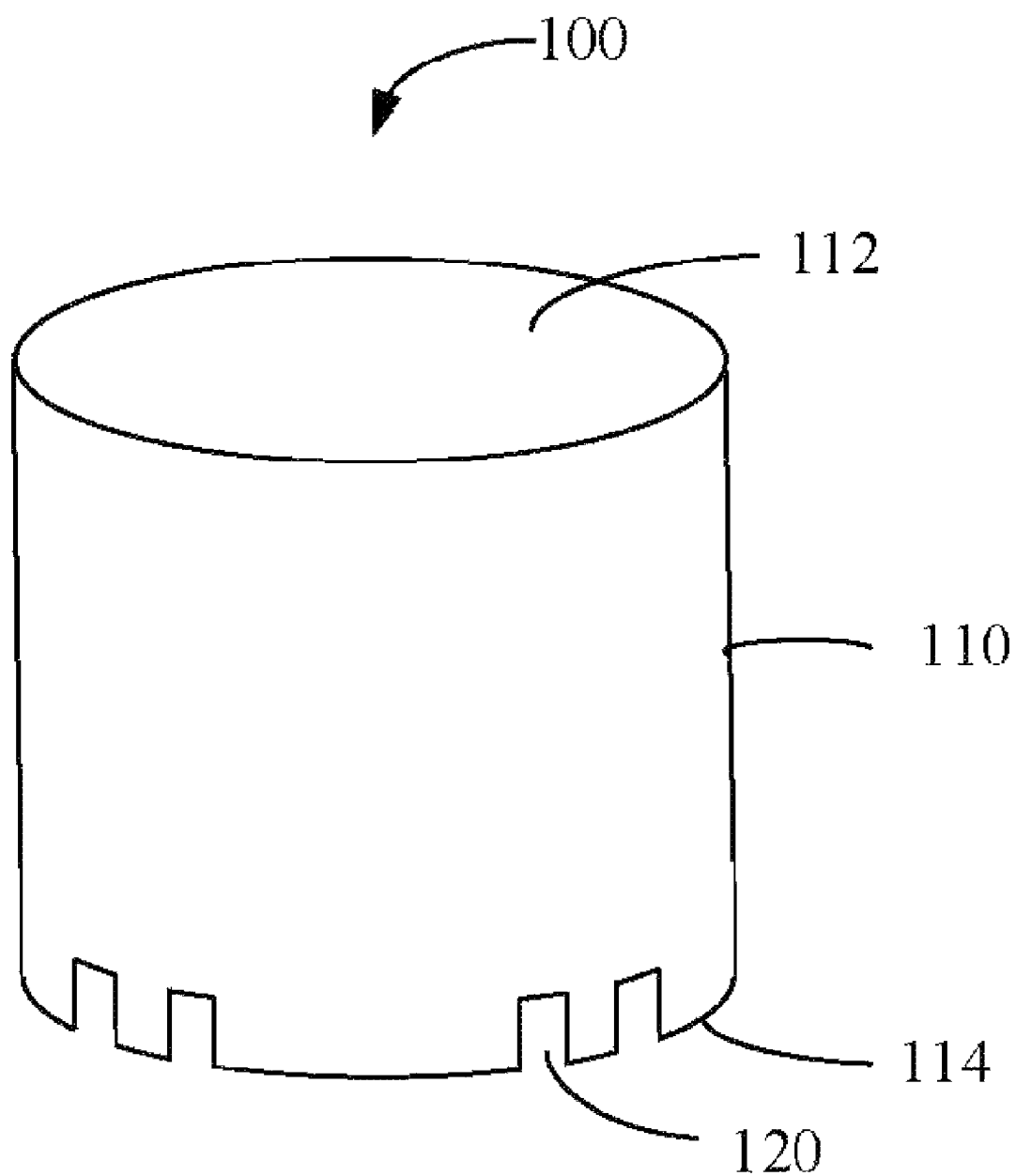
FIG. 2 is a device used in a method for manufacturing a thermal interface material.
Figure 3:
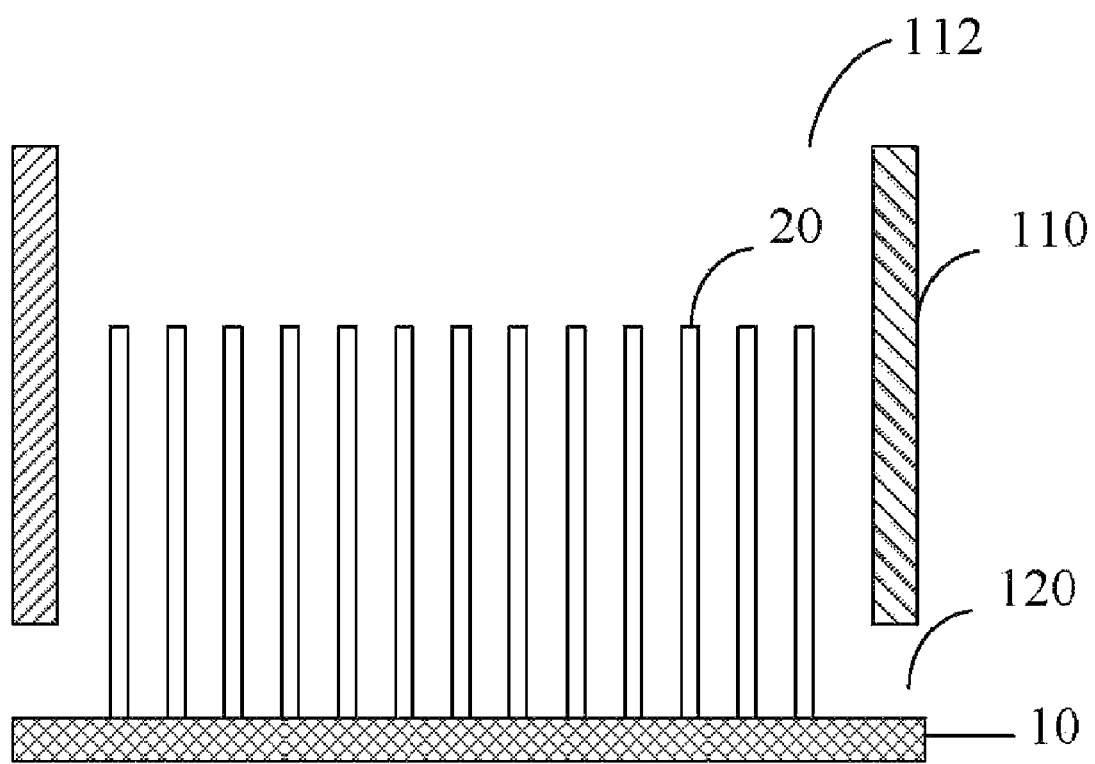
FIGS. 3-6 show schematic, cross-section views of the method for manufacturing a thermal interface material.

In the embodiment, the carbon nanotube array 20 is arranged into a device 100. Referring to FIG. 2, the device 100 is a hollow member that defines an inner space. The device 100 includes a sidewall 110 and at least one through hole 120. The sidewall 110 includes an upper opening 112 and a lower opening 114. The at least one through hole 120 is defined in the sidewall 110 adjacent to the lower opening 114. A cross-section of the device 100 can be, for example, a circle, a quadrangle, a triangle, or a polygon. In the embodiment, the cross-section of the device 100 is a circle. That is, the device 100 has the shape of a cylinder. Referring to FIG. 3, the lower opening 114 is in contact with and corresponds to the substrate 10 (i.e., the long-axes of the carbon nanotubes 22 are substantially parallel to the sidewall 110).

Figure 4:
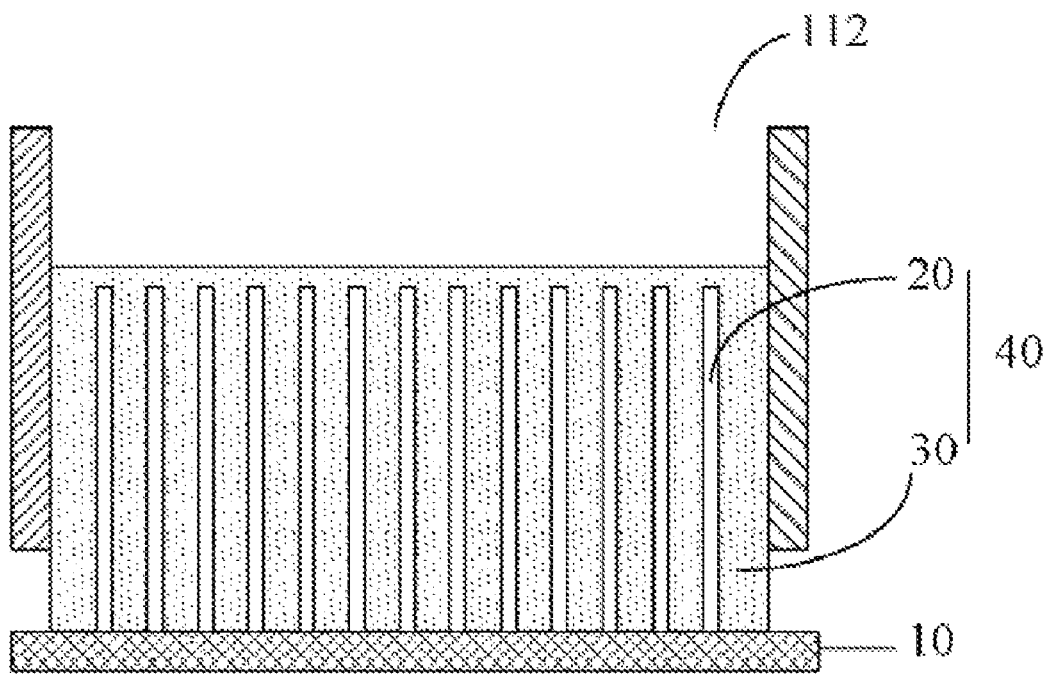

Referring to FIG. 4, in step 2, a liquid state first base material 30 is filled into the interstices 21, and then the liquid state first base material 30 is cured by cooling to room temperature to solidify the liquid state first base material 30, thereby forming a carbon nanotube/first base material composite 40. The liquid state first base material 30 is a melt or solution. The liquid state first base material 30 is filled into the interstices 21 by injecting via the upper opening 112, or by immersing the carbon nanotube array 20 with the substrate 10 and the device 100 into the liquid state first base material 30. Thereafter, the liquid state first base material 30 is treated by an ultrasonic process, the air in the interstices 21 is removed, and the first base material 30 can be completely filled into the interstices 21. The curing step can be performed by methods such as a cool hardening method or an ultraviolet (UV) curing method. In the embodiment, the liquid state first base material 30 is cooled to room temperature, and then a carbon nanotube/first base material composite 40 is formed.

The first base material 30 can be selected from a macromolecular material or a phase change material. The macromolecular material is selected from the group comprising silicone, polyester, polyvinyl chloride (PVC), polyvinyl alcohol (PVA), polyethylene, polypropylene, epoxy resin, polycarbonate (PC), polyoxymethylene, and a polyacetal. The phase change material is selected from the group comprising paraffin, polyolefin, low molecular weight polyester, low molecular weight epoxy resin, and a low molecular weight acrylic. In the preferred embodiment, paraffin is employed as the first base material 30.

Figure 5:
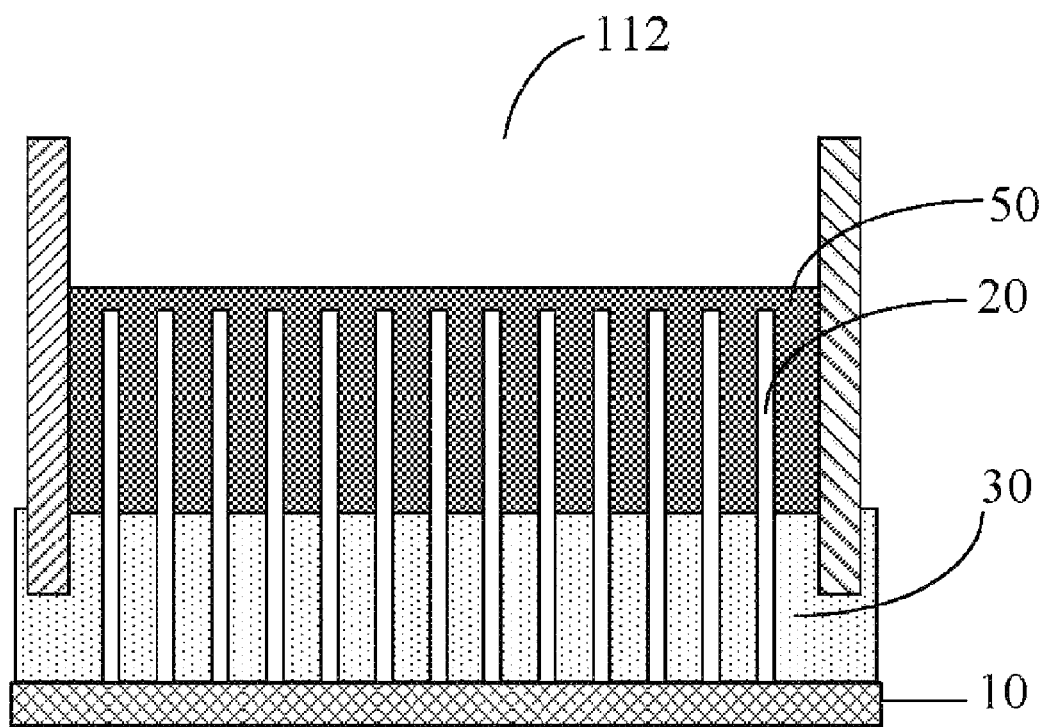
Figure 6:
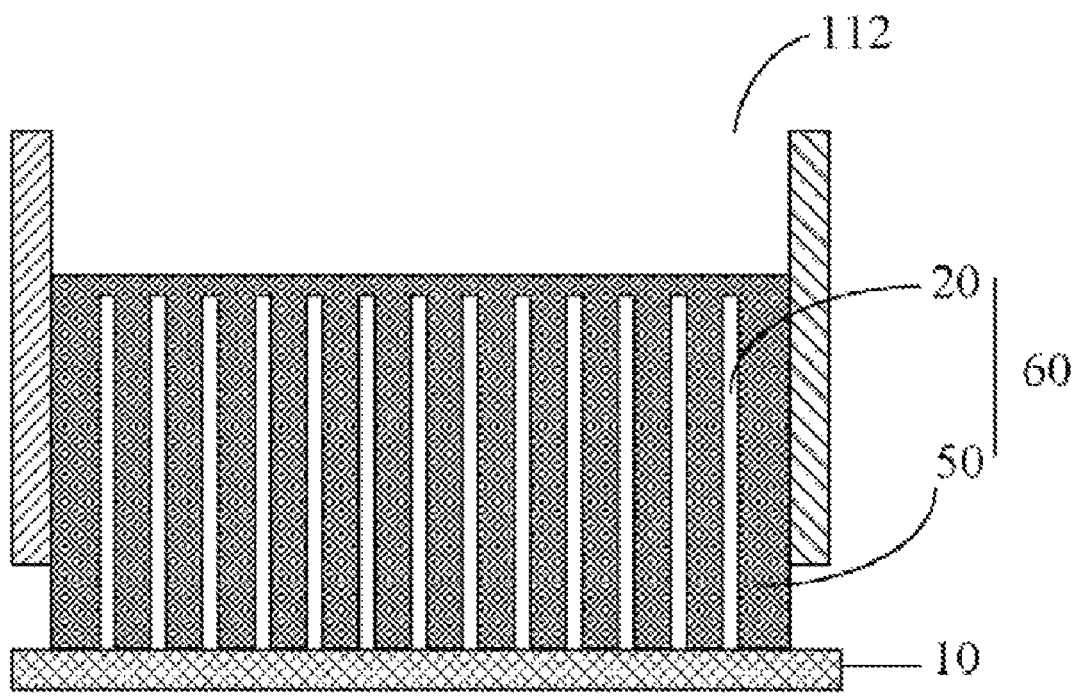

Referring to FIG. 5, in step 3, a liquid state second base material 50 is dripped onto the carbon nanotube/first base material composite 40. The liquid state second base material 50 is a melt with a high temperature. The second base material 50 has a higher melting point than the first base material 30. In the embodiment, the liquid state second base material 50 is filled via the upper opening 112 of the device 100. The first base material 30 of the carbon nanotube/first base material composite 40 is melt due to a high temperature of the liquid state second base material 50, and then leaks through the through hole 120. After the first base material 30 entirely leaks, the carbon nanotube array 22 is submerged in the second base material 50. The second base material composite 50 is cooled to room temperature for curing, and thereby a thermal interface material 60 (i.e., carbon nanotube/second base material composite) is achieved.

The second base material 50 has a melting point higher than the first base material 30. The second base material 50 is selected from the group consisting of indium, mercury, copper, titanium and an alloy thereof. In the embodiment, the second base material 50 is indium.

Preferably, the method for manufacturing the thermal interface material 60 further comprises a step of etching two opposite surfaces (not labeled) of the thermal interface material 60. Two opposite surfaces are substantially perpendicular to the long-axes of the carbon nanotubes. The etching step can be performed by a wet etching method, or by a dry etching method such as for example a reactive ion etching method. In the embodiment, a reactive ion etching method is used. Two opposite surfaces of the thermal interface material 60 are etched to ensure that tips of the carbon nanotubes 22 are exposed therefrom.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing a thermal interface material, the method comprising the steps of:
    (a) providing a carbon nanotube array formed on a substrate, the carbon nanotube array comprising a plurality of carbon nanotubes and a plurality of interstices between the adjacent carbon nanotubes;
    (b) filling a liquid state first base material into the interstices;
    (c) curing the first base material by cooling the first base material to room temperature to solidify the first base material, thereby achieving a carbon nanotube/first base material composite;
    (d) dripping a liquid state second base material onto a surface of the carbon nanotube/first base material composite, the first base material melting due to a temperature of the liquid state second base material being higher than a melting point temperature of the first base material, and the liquid state first base material flowing out of the carbon nanotube/first base material composite until the carbon nanotube array is substantially submerged in the second base material; and
    (e) curing the second base material by cooling the second base material to room temperature to solidify the second base material, thereby achieving a thermal interface material.

2. The method for manufacturing a thermal interface material as claimed in claim 1, wherein in step (a), the carbon nanotubes in the carbon nanotube array are substantially parallel to each other and substantially perpendicular to the substrate.

3. The method for manufacturing a thermal interface material as claimed in claim 1, wherein in step (b), the liquid state first base material is filled into the interstices by immersing the carbon nanotube array into a melt or solution of the first base material or by injecting.

4. The method for manufacturing a thermal interface material as claimed in claim 1, wherein a step of treating the first base material and the carbon nanotube array is further provided before step (c), and the step is executed by an ultrasonic process to remove the air in the interstices.

5. The method for manufacturing a thermal interface material as claimed in claim 1, wherein in step (c), the liquid state first base material is cured by a cool hardening method or an ultraviolet curing method.

6. The method for manufacturing a thermal interface material as claimed in claim 1, wherein the second base material has a higher melting point than the first base material.

7. The method for manufacturing a thermal interface material as claimed in claim 1, wherein the second base material is selected from the group consisting of indium, copper, titanium and any alloy thereof.

8. The method for manufacturing a thermal interface material as claimed in claim 1, wherein the substrate is made from a material selected from the group consisting of glass, silicon, and metal.

9. The method for manufacturing a thermal interface material as claimed in claim 1, wherein the first base material is a macromolecular material or a phase change material.

10. The method for manufacturing a thermal interface material as claimed in claim 9, wherein the macromolecular material is selected from the group consisting of silicone, polyester, polyvinyl chloride (PVC), polyvinyl alcohol (PVA), polyethylene, polypropylene, epoxy resin, polycarbonate (PC), polyoxymethylene, and polyacetal.

11. The method for manufacturing a thermal interface material as claimed in claim 9, wherein the phase change material is selected from the group consisting of paraffin and polyolefin.

12. The method for manufacturing a thermal interface material as claimed in claim 1, further comprising a step of etching two opposite surfaces of the thermal interface material after step (e), wherein the two opposite surfaces are substantially perpendicular to a long-axis of each of the carbon nanotubes.

13. The method for manufacturing a thermal interface material as claimed in claim 12, wherein the etching step is performed by a wet etching method, or by a dry etching method.

14. A method for manufacturing a thermal interface material, comprising the steps of:
  (a) providing a device, the device being a hollow member that defines an inner space, wherein the device comprises a sidewall and at least one through hole, the sidewall comprises an upper opening and a lower opening, and the at least one through hole is defined in the sidewall adjacent to the lower opening;
  (b) providing a carbon nanotube array formed on a substrate, the carbon nanotube array comprising a plurality of carbon nanotubes and a plurality of interstices between the adjacent carbon nanotubes;
  (c) arranging the carbon nanotube array with the substrate into the inner space of the device, the lower opening being in contact with and corresponding to the substrate;
  (d) filling a liquid state first base material into the interstices via the upper opening;
  (e) curing the first base material by cooling the first base material to room temperature to solidify the first base material, thereby achieving a carbon nanotube/first base material composite;
  (f) dripping a liquid state second base material onto a surface of the carbon nanotube/first base material composite via the upper opening, the first base material melting due to a temperature of the liquid state second base material being higher than a melting point temperature of the first base material, and the liquid state first base material leaking through the at least one through hole until the carbon nanotube array is substantially submerged in the second base material; and
  (g) curing the second base material by cooling the second base material to room temperature to solidify the second base material, thereby achieving a thermal interface material.

15. The method for manufacturing a thermal interface material as claimed in claim 14, wherein a long-axis of each of the carbon nanotubes of the carbon nanotube array is substantially parallel to the sidewall of the device.

* * * * *